United States Patent [19]
Acker

[11] 4,398,218
[45] Aug. 9, 1983

[54] SIGNAL MONITOR SYSTEM

[75] Inventor: William F. Acker, Seminole, Fla.

[73] Assignee: Honeywell Inc., Minneapolis, Minn.

[21] Appl. No.: 290,647

[22] Filed: Aug. 6, 1981

Related U.S. Application Data

[60] Continuation of Ser. No. 102,303, Dec. 10, 1979, abandoned, which is a division of Ser. No. 825,705, Sep. 1, 1977, Pat. No. 4,207,523.

[51] Int. Cl.³ .................... H03K 5/153; G01R 19/165
[52] U.S. Cl. ..................................... 328/150; 307/350; 307/354; 328/114; 328/147
[58] Field of Search ............... 307/350, 353, 354, 360, 307/358; 328/146-149, 151, 165, 114

[56] References Cited
U.S. PATENT DOCUMENTS 3,872,389  3/1975  Willard ............................... 328/147
3,961,271  6/1976  Zlydak ............................... 328/147

Primary Examiner—John Azaworsky
Attorney, Agent, or Firm—Theodore F. Neils

[57] ABSTRACT

Apparatus for identifying intended crossing events of a preselected value of an analog signal is disclosed. The apparatus further identifies whether the signal is rising or falling during those crossing events.

12 Claims, 1 Drawing Figure

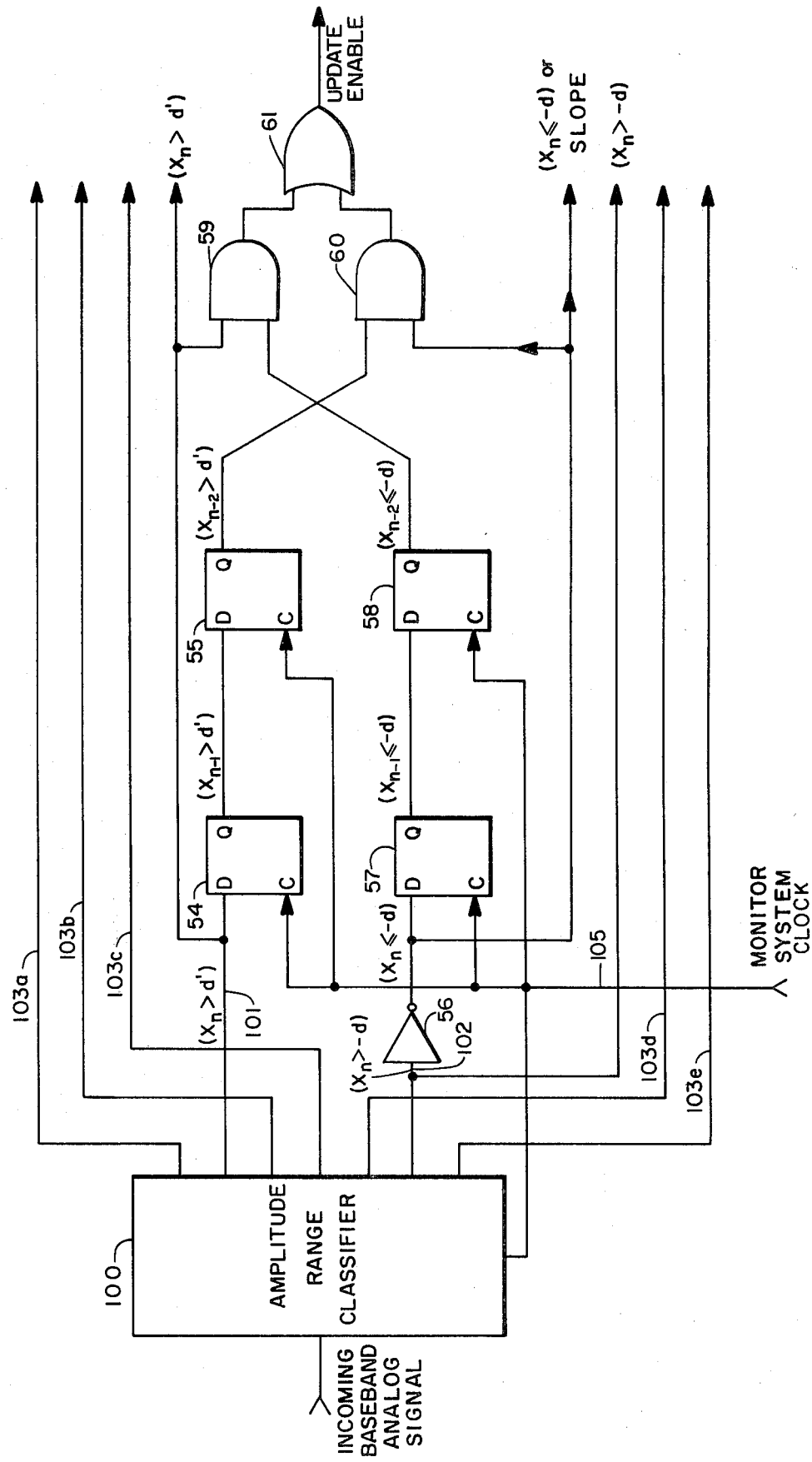

SIGNAL MONITOR SYSTEM

The invention herein described was made in the course of, or under a contract, or subcontract thereunder, with the Department of the Air Force.

This application is a continuation of application Ser. No. 102,303 filed Dec. 10, 1979, and now abandoned, which was a division of application Ser. No. 825,705, filed Sept. 1, 1977, now U.S. Pat. No. 4,207,523, issued June 10, 1980. That patent is incorporated herein by reference.

BACKGROUND OF THE INVENTION

The present invention relates generally to communication channel quality monitor systems, and more particularly, to monitoring systems for indicating the intended values of signals in the communications channel if uncorrupted by noise and for indicating the extent of any such corruption occurring. Specifically it relates to an apparatus, which would be suitable for use in such a monitor system, which determines when the amplitude of a signal provided thereto crosses a preselected value, and the direction of that crossing.

Communication channels can be entirely analog extending from the information source to the transmitter, and then along the channel link to the receiver, and finally to the user of the transmitted information. Communication channels can also be digitally based, either totally or partially. A typical situation is to have a digital information source but where the information is sent over an analog channel link to a receiver which reconverts the information to a digital format.

Digital communication channels or communication channels having digital portions along the channel, i.e. digitally based communication channels hereinafter, are designed to have as large a tolerance for noise and other signal degradations as practicable. Such a system can have so large a designed-in tolerance that the system will operate substantially error free even though one or more elements thereof comes to operate in a severely degraded manner.

A major objective of performance monitoring is to detect such element degradation before corresponding errors are introduced, to thereby permit corrections or other expedients to prevent any such errors before they begin to occur in the communications channel. In a system for providing such performance monitoring of digitally based communication channels, a device may be needed for determining the times at which the amplitude of the incoming signal crosses a preselected level and whether the signal level is rising or falling at the times of those crossings.

SUMMARY OF THE INVENTION

The present invention provides an apparatus for identifying as countable data samples those occurring in baud periods during which the amplitude of the incoming baseband analog signal crosses a preselected value. Such countable data samples are located by identifying an acceptable pair of data samples, each member of which is adjacent in time to the countable data sample with which it is associated, wherein one member of the acceptable pair has an amplitude value greater than the selected value and the other member of the acceptable pair has an amplitude value less than the selected value. The apparatus of the invention further provides means for determining whether the amplitude of the incoming baseband analog signal is rising or falling when the selected amplitude value is crossed.

BRIEF DESCRIPTION OF THE DRAWING

The sole FIGURE is a block diagram of the level crossing and crossing direction detector of the invention.

DESCRIPTION OF THE PREFERRED EMBODIMENT

The preferred embodiment of the invention will be described as it would be implemented in a three level partial response digitally based communication channel. The center expected signal level is assumed to be zero volts, while the upper and lower expected signal levels are assumed to be $+2d'$ and $-2d$ volts, respectively. The upper and lower decision levels are taken to be $+d'$ and $-d$ volts, respectively. This means that when the incoming baseband analog signal has an amplitude value at selected times greater than $+d'$ volts the signal will be interpreted as having an intended amplitude value of $+2d'$ volts and when the incoming baseband analog signal has an amplitude value at selected times less than or equal to $-d$ volts the signal will be interpreted as having an intended amplitude value of $-2d$ volts. For values of the incoming baseband analog signal which occur between $d$ and $-d$ volts at selected times, the signal will be interpreted as having an intended amplitude value of zero volts.

In the preferred embodiment the system identifies those instances in which the incoming baseband analog signal crosses the center expected signal level of zero volts and the direction of the crossing. This information is inferable whenever (i) the data sample preceding the data sample in question was a data sample having an amplitude intended to equal the upper expected incoming signal level, and the data sample following the data sample in question has an amplitude intended to equal the lower expected incoming signal level to form a falling signal pattern, or (ii) the data sample preceding the data sample in question was a data sample having an amplitude intended to equal the lower expected incoming signal level, and the data sample following the data sample in question has an amplitude intended to equal the upper expected incoming signal level to form a rising signal pattern. In both of these instances, the incoming baseband analog signal is known to have passed through, or nearly through, zero at the sampling time of the data sample in question. And, in the first instance, one knows the incoming baseband analog signal was falling at the time the data sample in question was obtained, while in the second instance, one knows that the incoming baseband analog signal was rising at the time the data sample in question was obtained.

In more detail, this information is to be determined by noting (i) whether the incoming baseband analog signal was nominally at the lower expected incoming signal level in the baud period previous to that baud period in which the data sample in question appears and whether the incoming signal then proceeds to nominally the upper expected incoming signal level in the baud period following the baud period in which the data sample in question appears, or (ii) whether the incoming baseband analog signal was nominally at the upper expected incoming signal level in the baud period previous to the baud period in which the data sample in question appears and whether the incoming signal then proceeds to nominally the lower expected incoming signal level in the baud period following the baud period in which the data sample in question appears. If so, then the data sample in question, as a countable data sample, will separate a pair of acceptable data samples in such a manner as to provide one or the other of the following patterns: (i) $X_{n-2} = +2d'$, $X_{n-1} = 0$, $X_n = -2d$, or (ii) $X_{n-2} = -2d$, $X_{n-1} = 0$, $X_n = +2d'$. In these equations $X_n$ represents the amplitude of the incoming baseband analog signal during the current baud period, $X_{n-1}$ represents the amplitude of the incoming baseband analog signal during the baud period immediately preceding the current baud period, and $X_{n-2}$ represents the amplitude of the incoming baseband signal during the baud period immediately preceding the n−1 baud period. The data samples $X_{n-2}$ and $X_n$ form, in each of those instances, a pair of acceptable data samples separated by the countable data sample $X_{n-1}$.

Turning now to the FIGURE, there is provided a logic diagram for a logic system capable of detecting the foregoing sequences of data samples in the stream of data samples obtained from the incoming baseband analog signal.

That signal enters an amplitude range classifier, 100, which generates a set of logic signals the values of which are related to the amplitude of the incoming baseband analog signal. An amplitude range classifier capable of being used for this purpose is described in U.S. Pat. No. 4,207,523, previously cited. The signals carried by the lines exiting from amplitude range classifier 100 will take on a logical value of true if the incoming baseband analog signal has an amplitude in the range associated with that line and a logical value of false if it is not in that range. For example, the signal carried by line 101 will have a logical value of true if and only if the incoming baseband analog signal has an amplitude greater than d' volts. The signal carried by line 102 will have a logical value of true if and only if the incoming baseband analog signal has an amplitude greater than −d volts. If these conditions are not met the signal carried by the appropriate line or lines will assume a logical value of false. Lines 103a, b, c, d, and e carry similar signals for other amplitude ranges used elsewhere in the monitor system. The exact number of lines may vary as determined by the requirements of particular embodiment of the monitor system being used. In the FIGURE these logic signals have been shown written with a counting subscript, n, to indicate which baud period the logic signal represents, as described above.

In the FIGURE, when the logic signal $(X_n > d')$ is true, the amplitude value $X_n$ of the data sample in the $n^{th}$ baud period in the incoming baseband analog signal is nominally at the upper expected incoming signal level of $+2d'$ volts. The comparator decision as to whether or not this inequality is satisfied in the $n^{th}$ baud period is correspondingly inserted into a flip-flop, 54. This process is repeated for each baud period. Thus, the information is available as to whether or not this inequality was satisfied in the baud period immediately preceding the current one by virtue of the storage of this information in that preceding baud period in flip-flop 54. Further, the information as to whether this inequality was satisfied or not two baud periods previous to the current baud period is transferred to and retained in another flip-flop, 55, connected to the output of flip-flop 54. The outputs of flip-flops 54 and 55 are thus the logic signals $(X_{n-1} > d')$ and $(X_{n-2} > d')$, respectively. Flip-flops 54 and 55, therefore, form a high range storage means.

When the logic signal $(X_n > -d)$ is false, the current data sample has an amplitude $X_n$ intended to equal the lower expected incoming signal level of $-2d$ volts. Therefore, the logic signal $(X_n > -d)$ is passed through an inverter, 56, to provide the logic signal $(X_n \leq -d)$. This logic signal is stored for the baud period immediately previous to the current one in a flip-flop, 57, and is transferred and retained for two baud periods previous to the current one in another flip-flop, 58, connected to the output of flip-flop 57. The logic signals available at the outputs of flip-flops 57 and 58 are $(X_{n-1} \leq -d)$ and $X_{n-2} \leq -d)$, respectively. Flip-flops 57 and 58, therefore, form a low range storage means.

With this information available from flip-flops 54, 55, 57 and 58, the presence of one of the desired data sample patterns, described above, in the stream of data samples obtained from the incoming baseband analog signal can be detected. Two AND gates, 59 and 60, are used to detect the desired patterns of data samples, each of these AND gates being capable of detecting one of the desired patterns. AND gate 59 detects presence of a countable data sample obtained from the incoming baseband analog signal at a time when this signal is in an increasing pattern. One input to AND gate 59 is supplied with the current baud period logic signal $(X_n > d')$ which indicates whether the current data sample $X_n$ has an amplitude nominally equal to the upper expected incoming signal level of $+2d'$ volts. The other input of AND gate 59 is supplied the logic signal $(X_{n-2} \leq -d)$ which indicates whether the data sample occurring two baud periods previous to the current baud period has an amplitude value that was nominally equal to the lower expected incoming signal level of $-2d$ volts.

If both of these signals supplied to AND gate 59 are true, there is a rising pattern in the incoming baseband analog signal occurring over the current baud period and the past two baud periods and, necessarily, the data sample occurring one baud period previous to the current baud period $X_{n-1}$ must have an amplitude value intended to equal the center expected incoming signal level. AND gate 60, in a similar manner, detects whether the data sample in the baud previous to the current baud $X_{n-1}$ has an amplitude value intended to equal the center expected incoming signal level and whether this data sample was obtained from the incoming baseband analog signal during a time this signal was in a decreasing pattern occurring over the current baud period and the two previous baud periods. Hence, AND gate 60 also determines certain data samples to be countable data samples.

Since either of these data sample patterns are to be accepted as indications of countable data samples in the manner and for the purposes of the monitor system, the outputs of AND gates 59 and 60 are supplied to an OR gate, 61. OR gate 61 provides an output signal, UPDATE ENABLE, indicating that one or the other of the pertinent data sample patterns has occurred over the current baud period and the two previous baud periods. Thus, the UPDATE ENABLE signal indicates that the data sample in the previous baud period was a countable data sample, a data sample obtained when an increasing or decreasing pattern incoming baseband analog signal portion passed through the center expected incoming signal level of zero volts.

A data sample, obtained from the incoming baseband analog signal in the current baud period, will have an amplitude occurring nominally at either the upper expected incoming signal level or at the lower expected incoming signal level at times when the UPDATE ENABLE signal is true indicating this data sample is a member of an acceptable pair of data samples separated by a countable data sample. Such a current data sample will indicate whether the incoming baseband analog signal was in an increasing or decreasing pattern, i.e. its slope direction, positive or negative, when this signal passed through zero volts in the baud period before the current one. Hence, either one of the logic signals $(X_n > d')$ or $(X_n \leq -d)$ can serve to indicate the slope direction of the incoming baseband analog signal for each associated zero crossing event.

Thus, in the FIGURE, the logic signal $(X_n \leq -d)$ indicating whether or not the data sample obtained from the incoming baseband analog signal in the current baud period has an amplitude nominally equal to the lower expected incoming signal level has been taken as an output in the FIGURE. If logic signal $(X_n \leq -d)$ is true, a falling pattern has been detected if UPDATE ENABLE is also true. For this output, the output signal shown can be taken as either the logic signal $(X_n \leq -d)$, or redesignated as the logic signal, SLOPE.

I claim:

1. An intended reference level crossing detector means, adapted to receive a data signal formed as a sequence of data samples, having a crossing detector output, said reference level crossing detector means comprising:

an incoming signal amplitude range classifier for determining whether said data samples are within certain amplitude ranges and having first and second classifier outputs, said incoming signal amplitude range classifier being capable of providing (i) as a first classifier output signal an indication for each said data sample, at said first classifier output, whether that said data sample has a value that is within a first selected range, and providing (ii) as a second classifier output signal an indication for each said data sample, at said second classifier output, whether that said data sample has a value that is within a second selected range;

a high range storage means having a high range storage means input and a high range storage means output, said high range storage means being capable of providing as a high range storage means output signal an indication, at said high range storage means output, whether a said data sample, preceding that said data sample corresponding to a current value of said first classifier output signal, had a value that was within said first selected range, said high range storage means input being connected to said first classifier output;

a low range storage means having a low range storage means input and a low range storage means outut, said low range storage means being capable of providing as a low range storage means output signal an indication, at said low range storage means output, whether a said data sample, preceding that said data sample corresponding to a current value of said second classifier output signal, had a value that was within said second selected range, said low range storage means input being connected to said second classifier output;

a falling pattern AND logic gate means having first and second falling pattern AND logic gate means inputs and a falling pattern AND logic gate means output, said first falling pattern AND logic gate means input being connected to said second classifier output and said second falling pattern AND logic gate means input being connected to said high range storage means output;

a rising pattern AND logic gate means having first and second rising pattern AND logic gate means inputs and a rising pattern AND logic gate means output, said first rising pattern AND logic gate means input being connected to said first classifier output and said second rising pattern AND logic gate means output being connected to said low range storage means output; and a combining OR logic gate means having first and second combining OR logic gate means inputs and a combining OR logic gate means output, said first combining OR logic gate means input being connected to said falling pattern AND logic gate means output and said second combining OR logic gate means input being connected to said rising pattern AND logic gate means output.

2. The intended reference level crossing detector means of claim 1 wherein said low range storage means input serves also as an intended reference level crossing detector means slope direction output.

3. The intended reference level crossing detector means of claim 1 wherein said high range storage means input serves also as an intended reference level crossing detector means slope direction output.

4. The intended reference level crossing detector means of claim 1, claim 2, or claim 3 wherein said high range storage means includes a high range storage means first flip-flop.

5. The intended level crossing detector means of claim 4 wherein said high range storage means further includes a high range storage means second flip-flop, each of said high range storage means first and second flip-flops having an input and an output, said high range storage means first flip-flop input serving as said high range storage means input, and said high range storage means first flip-flop output being connected to said high range storage means second flip-flop input, and said high range storage means second flip-flop output serving as said high range storage means output.

6. The intended reference level crossing detector means of claim 5 wherein said high range storage means first and second flip-flops are D-type flip-flops.

7. The intended reference level crossing detector means of claim 1, claim 2, or claim 3 wherein said low range storage means includes a low range storage means first flip-flop.

8. The intended reference level crossing detector means of claim 7 wherein said low range storage means further comprises a low range storage means second flip-flop, each of said low range storage means first and second flip-flops having an input and an output, said low range storage means first flip-flop input serving as said low range storage means input, and said low range storage means first flip-flop output being connected to said low range storage means second flip-flop input, and said low range storage means second flip-flop output serving as said low range storage means output.

9. The intended reference level crossing detector means of claim 8 wherein said low range storage means first and second flip-flops are D-type flip-flops.

10. The intended reference level crossing detector means of claim 8 wherein said high range storage means includes high range storage means first and second flip-flops, each of said high range storage means flip-flops having an input and an output, said high range storage means first flip-flop input serving as said high range storage means input, and said high range storage means first flip-flop output being connected to said high range storage means second flip-flop input, and said high range storage means second flip-flop output serving as said high range storage means output.

11. The intended reference level crossing detector means of claim 10 wherein all of said flip-flops are D-type flip-flops.

12. The intended reference level crossing detector means of claim 11 wherein said falling pattern AND logic gate means is an AND logic gate and said rising pattern AND logic gate means is an AND logic gate and said combining OR logic gate means is an OR logic gate.

* * * * *